United States Patent
Ku et al.

(10) Patent No.: US 10,490,246 B2
(45) Date of Patent: Nov. 26, 2019

(54) SEMICONDUCTOR DEVICE AND SEMICONDUCTOR SYSTEM

(71) Applicant: SK hynix Inc., Icheon (KR)

(72) Inventors: Sang Hyun Ku, Seongnam (KR); HongJung Kim, Icheon (KR)

(73) Assignee: SK HYNIX INC., Icheon (KR)

( * ) Notice: Subject to any disclaimer, the term of this patent is extended or adjusted under 35 U.S.C. 154(b) by 52 days.

(21) Appl. No.: 15/624,458

(22) Filed: Jun. 15, 2017

(65) Prior Publication Data

US 2018/0174632 A1    Jun. 21, 2018

(30) Foreign Application Priority Data

Dec. 21, 2016 (KR) .................. 10-2016-0175759

(51) Int. Cl.
| | |
|---|---|
| *G11C 8/10* | (2006.01) |
| *G11C 8/18* | (2006.01) |
| *G11C 29/00* | (2006.01) |
| *G11C 8/12* | (2006.01) |
| *G11C 17/16* | (2006.01) |
| *G11C 29/12* | (2006.01) |

(52) U.S. Cl.
CPC .................. *G11C 8/18* (2013.01); *G11C 8/10* (2013.01); *G11C 8/12* (2013.01); *G11C 17/16* (2013.01); *G11C 29/76* (2013.01); *G11C 29/781* (2013.01); *G11C 29/832* (2013.01); *G11C 29/84* (2013.01); *G11C 29/835* (2013.01); *G11C 2029/1202* (2013.01)

(58) Field of Classification Search
CPC .................................... G11C 8/18; G11C 8/10
USPC .......................................................... 365/96
See application file for complete search history.

(56) References Cited

U.S. PATENT DOCUMENTS

| | | | | |
|---|---|---|---|---|
| 5,970,003 A | * | 10/1999 | Miyatake | G11C 17/16 365/200 |
| 8,072,827 B2 | * | 12/2011 | Wakimoto | G11C 11/406 365/200 |
| 2002/0027828 A1 | * | 3/2002 | Ikeda | G11C 7/1078 365/230.08 |
| 2012/0026815 A1 | * | 2/2012 | Komatsu | G11C 29/24 365/200 |
| 2015/0310926 A1 | | 10/2015 | Akamatsu | |

FOREIGN PATENT DOCUMENTS

KR    10-2005-0011923 A    1/2005

* cited by examiner

*Primary Examiner* — Amir Zarabian
*Assistant Examiner* — Muna A Techane

(57) ABSTRACT

A semiconductor system includes a first semiconductor device and a first semiconductor device. The first semiconductor device outputs a clock, a chip selection signal and addresses. The second semiconductor device generates a masking signal from the addresses inputted in synchronization with a first pulse of the clock in response to the chip selection signal and decodes internal addresses generated from the addresses inputted in synchronization with a second pulse of the clock to select a word line. The second semiconductor device controls a connection between an address decoder and a fuse circuit in response to the masking signal. The address decoder selects the word line.

7 Claims, 6 Drawing Sheets

FIG. 2

| MA<2> | MA<1> | MSK<4> | MSK<3> | MSK<2> | MSK<1> |
|---|---|---|---|---|---|
| L | L | L | L | L | H |
| L | H | L | L | H | L |
| H | L | L | H | L | L |
| H | H | H | L | L | L |

SEMICONDUCTOR DEVICE AND SEMICONDUCTOR SYSTEM

CROSS-REFERENCE TO RELATED APPLICATION

The present application claims priority under 35 U.S.C. § 119(a) to Korean Patent Application Number 10-2016-0175759, filed on Dec. 21, 2016, in the Korean Intellectual Property Office, which is incorporated herein by reference in its entirety.

BACKGROUND

1. Technical Field

Embodiments of the present disclosure relate to a semiconductor device and a semiconductor system, each of which controls a connection between an unused address decoder and a fuse circuit according to an address.

2. Related Art

Attempts to increase integration and density in semiconductor devices have typically resulted in the increase of failed memory cells in fabrication of the semiconductor devices. This may lead to lowering a fabrication yield of the semiconductor devices. Even when a semiconductor device includes a single defective memory cell, the semiconductor device cannot be supplied to customers.

A lot of effort has been focused on improving a fabrication yield of highly integrated semiconductor devices. For example, various techniques for repairing defective (or failed) memory cells using fuses have been proposed to improve the fabrication yield of the highly integrated semiconductor devices.

A semiconductor device such as a semiconductor memory device may be designed to include fuses that are used to store information necessary for controlling various internal operations, for example, various setting information or repair information on failed memory cells that abnormally operate. General fuses can be programmed using laser beams in a wafer level because a logic level of each data is determined according to an electrical open/short state of each fuse. However, once semiconductor devices are encapsulated to form a semiconductor package, it may be impossible to program general fuses in the semiconductor package. Therefore, e-fuses are widely used to solve the aforementioned disadvantage. An e-fuse may be realized using a transistor, for example, a MOS transistor. In such a case, data may be stored in the e-fuse by changing an electrical resistance value between a gate terminal and a source/drain terminal of the MOS transistor, which is used as the e-fuse. That is, the e-fuse may be electrically open or short according to the resistance value between the gate terminal and the source/drain terminal of the MOS transistor.

SUMMARY

Various embodiments are directed to a semiconductor system capable of reducing a load of address decoders by cutting off a connection between a fuse circuit and an unused address decoder according to an address for selecting a target bank.

In an embodiment, a semiconductor system includes a first semiconductor device and a first semiconductor device. The first semiconductor device outputs a clock, a chip selection signal and addresses. The second semiconductor device generates a masking signal from the addresses inputted in synchronization with a first pulse of the clock in response to the chip selection signal and decodes internal addresses generated from the addresses inputted in synchronization with a second pulse of the clock to select a word line. The second semiconductor device controls a connection between an address decoder and a fuse circuit in response to the masking signal. The address decoder selects the word line.

In an embodiment, a semiconductor system includes a first semiconductor device and a first semiconductor device. The first semiconductor device outputs a clock, a chip selection signal, addresses and first and second masking signals. The second semiconductor device decodes internal addresses generated from the addresses inputted in synchronization with the clock in response to the chip selection signal to select a word line. The second semiconductor device controls a connection between first and second address decoders and first and second fuse circuits in response to the first and second masking signals. The first and second address decoders select the word line.

In an embodiment, a semiconductor device includes an address input circuit, a masking signal generation circuit, an internal address generation circuit and a word line signal generation circuit. The address input circuit receives addresses in synchronization with a first pulse of a clock in response to a chip selection signal to output the addresses as masking addresses, and receives the addresses in synchronization with the second pulse of the clock to output the addresses as row addresses. The masking signal generation circuit decodes the masking addresses to generate first and second masking signals. The internal address generation circuit decodes the row addresses to generate internal addresses. The word line signal generation circuit controls a connection between a first address decoder and a first fuse circuit in response to the first masking signal, and controls a connection between a second address decoder and a second fuse circuit in response to the second masking signal. The word line signal generation circuit decodes the internal addresses to generate first and second word line signals.

BRIEF DESCRIPTION OF THE DRAWINGS

FIG. 2 is a table illustrating an operation of a masking signal generation circuit included in the semiconductor system of FIG. 1 according to an embodiment;

DETAILED DESCRIPTION

Various embodiments of the present disclosure will be described hereinafter with reference to the accompanying drawings. However, the embodiments described herein are for illustrative purposes only and are not intended to limit the scope of the present disclosure.

Figure 1:
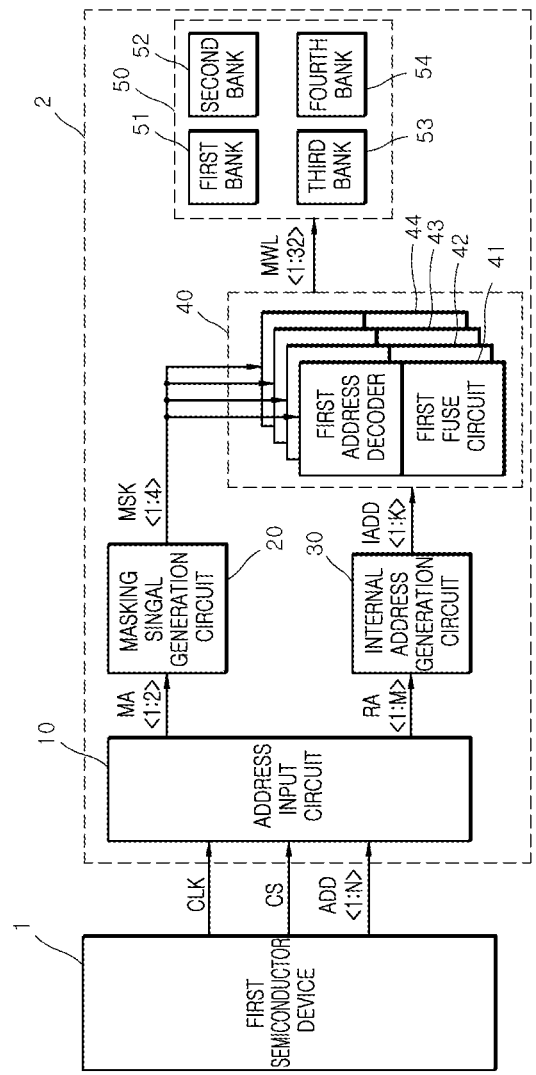
FIG. 1 is a block diagram illustrating a configuration of a semiconductor system according to an embodiment.

FIG. 1 is a block diagram illustrating a semiconductor system according to an embodiment. Referring to FIG. 1, the semiconductor system may include a first semiconductor device 1 and a second semiconductor device 2. The second semiconductor device 2 may include an address input circuit 10, a masking signal generation circuit 20, an internal address generation circuit 30, a word line signal generation circuit 40, and a memory region 50.

The first semiconductor device 1 may output a clock signal CLK, a chip selection signal CS, and addresses ADD <1:N>, N being a positive integer. The first semiconductor device 1 may output the clock signal CLK, which toggles. The first semiconductor device 1 may output the chip selection signal CS for entering an active operation. The first semiconductor device 1 may output the addresses ADD <1:N> in synchronization with the clock signal CLK. The first semiconductor device 1 may output the addresses ADD <1:N> for selecting the first to fourth banks 51, 52, 53, and 54, in synchronization with a first pulse of the clock signal CLK. The first semiconductor device 1 may output the addresses ADD <1:N> for selecting a plurality of word line groups included in the first to fourth banks 51, 52, 53, and 54, in synchronization with a second pulse of the clock signal CLK. A number N of bits included in the addresses ADD<1:N> may be implemented with various numbers of bits for selecting a plurality of word line groups included in the first to fourth banks 51, 52, 53, and 54. The first pulse of the clock signal CLK is a pulse that is generated in the active operation and is activated by the chip selection signal CS. The second pulse of the clock signal CLK is a second pulse that is generated in the active operation, the second pulse being inputted after the first pulse.

The address input circuit 10 may generate masking addresses MA <1:2> and row addresses RA <1:M> from the addresses ADD <1:N> inputted in synchronization with the clock signal CLK, in response to the chip select signal CS. The address input circuit 10 may generate the masking addresses MA <1:2> from the addresses ADD <1:N> inputted in synchronization with the first pulse of the clock signal CLK, in response to the chip select signal CS. The address input circuit 10 may generate the masking addresses MA <1:2> from the addresses ADD <1:N> inputted in synchronization with the first pulse of the clock signal CLK in the active operation.

The address input circuit 10 may generate the row addresses RA <1:M> from the addresses ADD <1:N> inputted in synchronization with the second pulse of the clock signal CLK in response to the chip select signal CS. The address input circuit 10 may generate the row addresses RA <1:M> from the addresses ADD <1:N> inputted in synchronization with the second pulse of the clock signal CLK in the active operation.

The masking addresses MA <1:2> may be generated from some bits of the addresses ADD <1:N> for selecting one of the first to fourth banks 51, 52, 53, and 54. The masking addresses MA <1:2> may be set to 2 bits for selecting one of the first to fourth banks 51, 52, 53, and 54, but may be set to various bits according to the number of banks.

The masking signal generation circuit 20 may decode the masking addresses MA <1:2> and generate masking signals MSK <1:4>. The masking signal generation circuit 20 may generate the masking signals MSK <1:4> selectively enabled according to a combination of the masking addresses MA <1:2>. The masking signal MSK <1:4> may be set to control a connection between first to fourth address decoders (411, 421, 431, and 441 in FIG. 3) and first to fourth fuse circuits (412, 422, 432, and 442 in FIG. 3), which correspond to the first to fourth banks 51, 52, 53, and 54. An operation of generating the masking signals MSK <1:4> according to the combination of the masking addresses MA <1:2> will be described in detail with reference to the drawings described later.

The internal address generation circuit 30 may decode the row addresses RA<1:M> and generate internal addresses IADD <1:K>. A number M of bits of the row addresses RA <1:M> and a bit number K of the internal addresses IADD <1:K> may each be set to a natural number.

The word line signal generation circuit 40 may decode the internal address IADD <1:K> and generate word line signals MWL <1:32>. The word line signal generation circuit 40 may control the connection between the first to fourth address decoders (411, 421, 431, and 441 in FIG. 3) and the first to fourth fuse circuits (412, 422, 432, and 442 in FIG. 3) in response to the masking signals MSK <1:4>.

More specifically, the word line signal generation circuit 40 may include a first word line signal generation circuit 41, a second word line signal generation circuit 42, a third word line signal generation circuit 43, and a fourth word line signal generation circuit 44.

The first word line signal generation circuit 41 may decode the internal addresses IADD <1:K> and generate first word line signals MWL <1:8>, which are signals for selecting a first word line group included in the first bank 51. The first word line signal generation circuit 41 may control the connection between the first address decoder (411 in FIG. 3) and the first fuse circuit (412 in FIG. 3) in response to the first masking signal MSK <1>.

The second word line signal generation circuit 42 may decode the internal addresses IADD <1:K> and generate second word line signals MWL <9:16>, which are signals for selecting a second word line group included in the second bank 52. The second word line signal generation circuit 42 may control the connection between the second address decoder (421 in FIG. 3) and the second fuse circuit (422 in FIG. 3) in response to the second masking signal MSK <2>.

The third word line signal generation circuit 43 may decode the internal addresses IADD <1:K> and generate third word line signals MWL <17:24>, which are signals for selecting a third word line group included in the third bank 53. The third word line signal generation circuit 43 may control the connection between the third address decoder (431 in FIG. 3) and the third fuse circuit (432 in FIG. 3) in response to the third masking signal MSK <3>.

The fourth word line signal generation circuit 44 may decode the internal addresses IADD <1:K> and generate fourth word line signals MWL <25:32>, which are signals for selecting a fourth word line group included in the fourth bank 54. The fourth word line signal generation circuit 44 may control the connection between the fourth address decoder (441 in FIG. 3) and the fourth fuse circuit (442 in FIG. 3) in response to the fourth masking signal MSK <4>.

Here, the first to fourth fuse circuits (412, 422, 432, and 442 in FIG. 3) may have the form of a general fuse circuit, in which a plurality of e-fuses are connected to form an array structure.

An operation of controlling the connection between the first to fourth address decoders (411, 421, 431, and 441 in FIG. 3) and the first to fourth fuse circuits (412, 422, 432, and 442 in FIG. 3) according to the masking signals MSK <1:4> will be described in detail with reference to the drawings described later.

The memory region 50 may include the first bank 51, the second bank 52, the third bank 53, and the fourth bank 54. The first bank 51, the second bank 52, the third bank 53, and the fourth bank 54 may be implemented with a general memory circuit including a plurality of word lines. The first bank 51, the second bank 52, the third bank 53, and the fourth bank 54 may be implemented with a general memory circuit further including a redundancy word line to replace a defective word line in which a failure occurs. The first bank 51, the second bank 52, the third bank 53, and the fourth bank 54 may input or output data to or from a cell coupled to a target word line selected by the word line signals MWL <1:32>. A number of banks included in the memory region 50 may be variously set according to embodiments.

In this embodiment, although each of the first bank 51, the second bank 52, the third bank 53, and the fourth bank 54 includes eight word lines for convenience of explanation, each of the first bank 51, the second bank 52, the third bank 53, and the fourth bank may include various numbers of word lines according to embodiments.

The second semiconductor device 2 may generate the masking signals MSK <1:4> using the addresses ADD <1:N> inputted in synchronization with the first pulse of the clock signal CLK in response to the chip selection signal CS. The second semiconductor device 2 may decode the internal addresses IADD <1:K> generated from the addresses ADD <1:N> inputted in synchronization with the second pulse of the clock signal CLK to select a target word line included in the first to fourth banks 51, 52, 53, and 54. The second semiconductor device 2 may control the connection between the first to fourth address decoders (411, 421, 431, and 441 in FIG. 3) and the first to fourth fuse circuits (412, 422, 432, and 442 in FIG. 3) to select the target word line in response to the masking signals MKS <1:4>.

FIG. 2 is a table illustrating an operation of the masking signal generation circuit 20 included in the semiconductor system of FIG. 1 according to an embodiment. The first to fourth masking signals MSK <1:4> generated based on the first and second masking addresses MA<1:2> by the masking signal generating circuit 20 will be described with reference to the table of FIG. 2.

The masking signal generation circuit 20 may generate the first masking signal MSK <1>, which is enabled to a logic high level (H) when the first masking address MA <1> has a logic low level (L) and the second masking address MA <2> has a logic low level (L).

The masking signal generation circuit 20 may generate the second masking signal MSK <2>, which is enabled to a logic high level (H) when the first masking address MA <1> has a logic high level (H) and the second masking address MA <2> has a logic low level (L).

The masking signal generation circuit 20 may generate the third masking signal MSK <3>, which is enabled to a logic high level (H) when the first masking address MA <1> has a logic low level (L) and the second masking address MA <2> has a logic high level (H).

The masking signal generation circuit 20 may generate the fourth masking signal MSK <4>, which is enabled to a logic high level (H) when the first masking address MA <1> has a logic high level (H) and the second masking address MA <2> has a logic high level (H).

Figure 3:
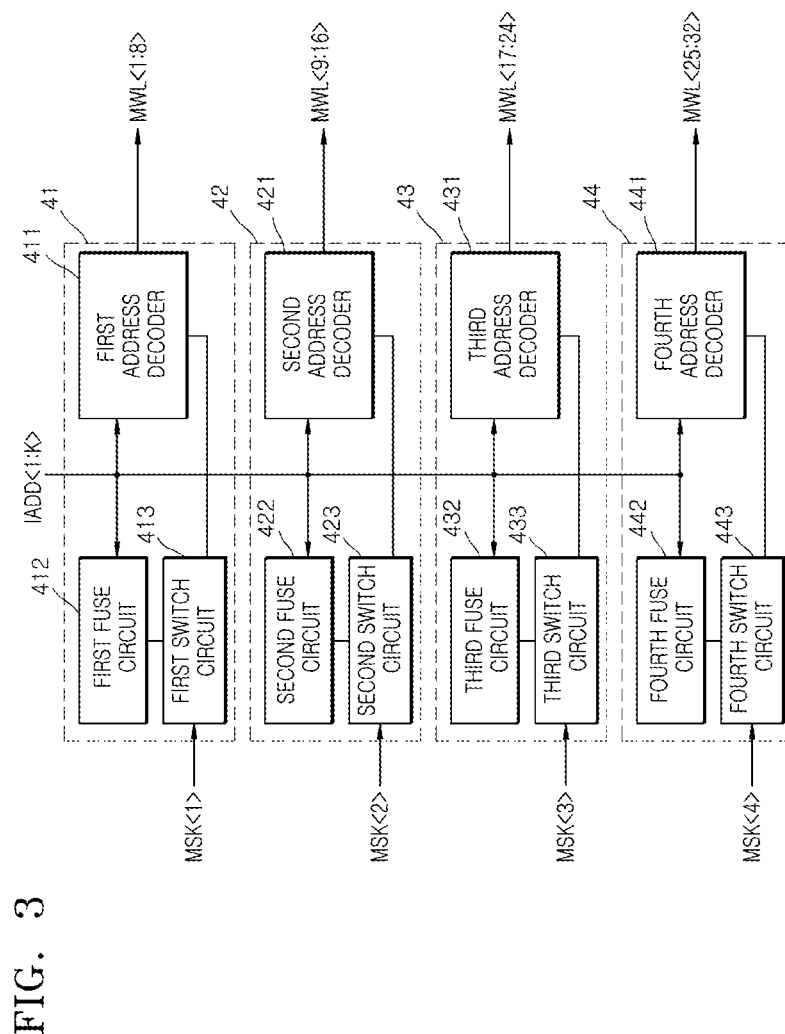
FIG. 3 is a block diagram illustrating an configuration of a word line signal generation circuit included in the semiconductor system of FIG. 1 according to an embodiment.

FIG. 3 is a block diagram illustrating the word line signal generation circuit 40 included in the semiconductor system of FIG. 1 according to an embodiment. Referring to FIG. 3, the word line signal generation circuit 40 may include the first word line signal generation circuit 41, the second word line signal generation circuit 42, the third word line signal generation circuit 43, and the fourth word line signal generation circuit 44.

The first word line signal generation circuit 41 may include a first address decoder 411, a first fuse circuit 412, and a first switch circuit 413.

The first address decoder 411 may decode the internal addresses IADD <1:K> and generate the first word line signals MWL <1:8>, which are selectively enabled. The first address decoder 411 may be an address decoder corresponding to the first bank 51. Thus, the first word line signals MWL <1:8> may be set to select one of word lines included in the first bank 51. The number of bits of the first word line signals MWL <1:8> is set to eight, but may be set to various numbers of bits depending on the number of word lines included in the first bank 51.

The first fuse circuit 412 may repair the internal addresses IADD <1:K> when the addresses ADD <1:N> have a logic level combination for selecting a defective word line included in the first bank 51. In an embodiment, e-fuses included in the first fuse circuit 412 may be programmed so that the first address decoder 411 decodes the internal addresses IADD <1:K> and generates the first word line signals MWL <1:8> for selecting a redundancy word line that replaces the defective word line when the internal addresses IADD <1:K> for selecting the defective word line are inputted.

The first switch circuit 413 may control a connection between the first address decoder 411 and the first fuse circuit 412 in response to the first masking signal MSK <1>. The first switch circuit 413 may connect the first address decoder 411 and the first fuse circuit 412 when the first masking signal MSK <1> is enabled to a logic high level, such that the first address decoder 411 and the first fuse circuit 412 can generate the first word line signals MWL <1:8> corresponding to the internal addresses IADD <1:K>. The first switch circuit 413 may cut off the connection between the first address decoder 411 and the first fuse circuit 412 when the first masking signal MSK <1> is disabled to a logic low level. Therefore, the first address decoder 411 and the first fuse circuit 412 cannot generate the first word line signals MWL <1:8> corresponding to the internal addresses IADD <1:K> when the first masking signal MSK <1> is disabled to a logic low level.

The second word line signal generation circuit 42 may include a second address decoder 421, a second fuse circuit 422, and a second switch circuit 423.

The second address decoder 421 may decode the internal addresses IADD <1:K> and generate the second word line signals MWL <9:16>, which are selectively enabled. The second address decoder 421 may be an address decoder corresponding to the second bank 52. Thus, the second word line signals MWL <9:16> may be set to select one of word lines included in the second bank 52. The number of bits of the second word line signals MWL <9:16> is set to eight, but may be set to various numbers of bits depending on the number of word lines included in the second bank 52.

The second fuse circuit 422 may repair the internal addresses IADD <1:K> when the addresses ADD <1:N> have a logic level combination for selecting a defective word line included in the second bank 52. In an embodiment, e-fuses included in the second fuse circuit 422 may be programmed so that the second address decoder 421 decodes the internal addresses IADD <1:K> and generates the first word line signals MWL <9:16> for selecting a redundancy word line when the internal addresses IADD <1:K> for selecting the defective word line are inputted. The redundancy word line may replace the defective word line.

The second switch circuit 423 may control a connection between the second address decoder 421 and the second fuse circuit 422 in response to the second masking signal MSK <2>. The second switch circuit 423 may connect the second address decoder 421 and the second fuse circuit 422 when the second masking signal MSK <2> is enabled to a logic high level, such that the second address decoder 421 and the second fuse circuit 422 can generate the second word line signals MWL <9:16> corresponding to the internal addresses IADD <1:K>. The second switch circuit 423 may cut off the connection between the second address decoder 421 and the second fuse circuit 422 when the second masking signal MSK <2> is disabled to a logic low level. Therefore, the second address decoder 421 and the second fuse circuit 422 cannot generate the second word line signals MWL <9:16> corresponding to the internal addresses IADD <1:K> when the second masking signal MSK <2> is disabled to a logic low level.

The third word line signal generation circuit 43 may include a third address decoder 431, a third fuse circuit 432, and a third switch circuit 433.

The third address decoder 431 may decode the internal addresses IADD <1:K> and generate the third word line signals MWL <17:24>, which are selectively enabled. The third address decoder 431 may be an address decoder corresponding to the third bank 53. Thus, the third word line signals MWL <17:24> may be set to select one of word lines included in the third bank 53. In the present embodiment, the number of bits of the third word line signals MWL <17:24> is set to eight, but may be set to various numbers of bits depending on the number of word lines included in the third bank 53.

The third fuse circuit 432 may repair the internal addresses IADD <1:K> when the addresses ADD <1:N> have a logic level combination for selecting a defective word line included in the third bank 53. In an embodiment, e-fuses included in the third fuse circuit 432 may be programmed so that the third address decoder 431 decodes the internal addresses IADD <1:K> and generates the third word line signals MWL <17:24> for selecting a redundancy word line that replaces the defective word line when the internal addresses IADD <1:K> for selecting the defective word line are inputted.

The third switch circuit 433 may control a connection between the third address decoder 431 and the third fuse circuit 432 in response to the third masking signal MSK <3>. The third switch circuit 433 may connect the third address decoder 431 and the third fuse circuit 432 when the third masking signal MSK <3> is enabled to a logic high level, such that the third address decoder 431 and the third fuse circuit 432 can generate the third word line signals MWL <17:24> corresponding to the internal addresses IADD <1:K>. The third switch circuit 433 may cut off the connection between the third address decoder 431 and the third fuse circuit 432 when the third masking signal MSK <3> is disabled to a logic low level. Therefore, the third address decoder 431 and the third fuse circuit 432 cannot generate the third word line signals MWL <17:24> corresponding to the internal addresses IADD <1:K> when the third masking signal MSK <3> is disabled to a logic low level.

The fourth word line signal generation circuit 44 may include a fourth address decoder 441, a fourth fuse circuit 442, and a fourth switch circuit 443.

The fourth address decoder 441 may decode the internal addresses IADD <1:K> and generate the fourth word line signals MWL <25:32>, which are selectively enabled. The fourth address decoder 441 may be an address decoder corresponding to the fourth bank 54. Thus, the fourth word line signals MWL <25:32> may be set to select one of word lines included in the fourth bank 54. The number of bits of the first word line signals MWL <25:32> is set to eight, but may be set to various numbers of bits depending on the number of word lines included in the fourth bank 54.

The fourth fuse circuit 442 may repair the internal addresses IADD <1:K> when the addresses ADD <1:N> have a logic level combination that is suitable for selecting a defective word line included in the fourth bank 54. In an embodiment, e-fuses included in the fourth fuse circuit 442 may be programmed so that the fourth address decoder 441 decodes the internal addresses IADD <1:K> and generates the fourth word line signals MWL <25:32> for selecting a redundancy word line that replaces the defective word line when the internal addresses IADD <1:K> for selecting the defective word line are inputted.

The fourth switch circuit 443 may control a connection between the fourth address decoder 441 and the fourth fuse circuit 442 in response to the fourth masking signal MSK <4>. The fourth switch circuit 443 may connect the fourth address decoder 441 and the fourth fuse circuit 442 when the fourth masking signal MSK <4> is enabled to a logic high level, such that the fourth address decoder 441 and the fourth fuse circuit 442 can generate the fourth word line signals MWL <25:32> corresponding to the internal addresses IADD <1:K>. The fourth switch circuit 443 may cut off the connection between the fourth address decoder 441 and the fourth fuse circuit 442 when the fourth masking signal MSK <4> is disabled to a logic low level. Therefore, the fourth address decoder 441 and the fourth fuse circuit 442 cannot generate the fourth word line signals MWL <25:32> corresponding to the internal addresses IADD <1:K> when the fourth masking signal MSK <4> is disabled to a logic low level.

An operation of repairing the internal addresses IADD <1:K>, which is performed by the first to fourth fuse circuits 412, 422, 432, and 442, is performed to select a redundancy word line instead of a defective word line when a logic level combination of the internal addresses IADD <1:K> is set to select the defective word line.

An operation of the semiconductor system having the aforementioned configuration illustrated in FIGS. 1 and 3 will be described hereinafter with reference to FIG. 4.

Figure 4:
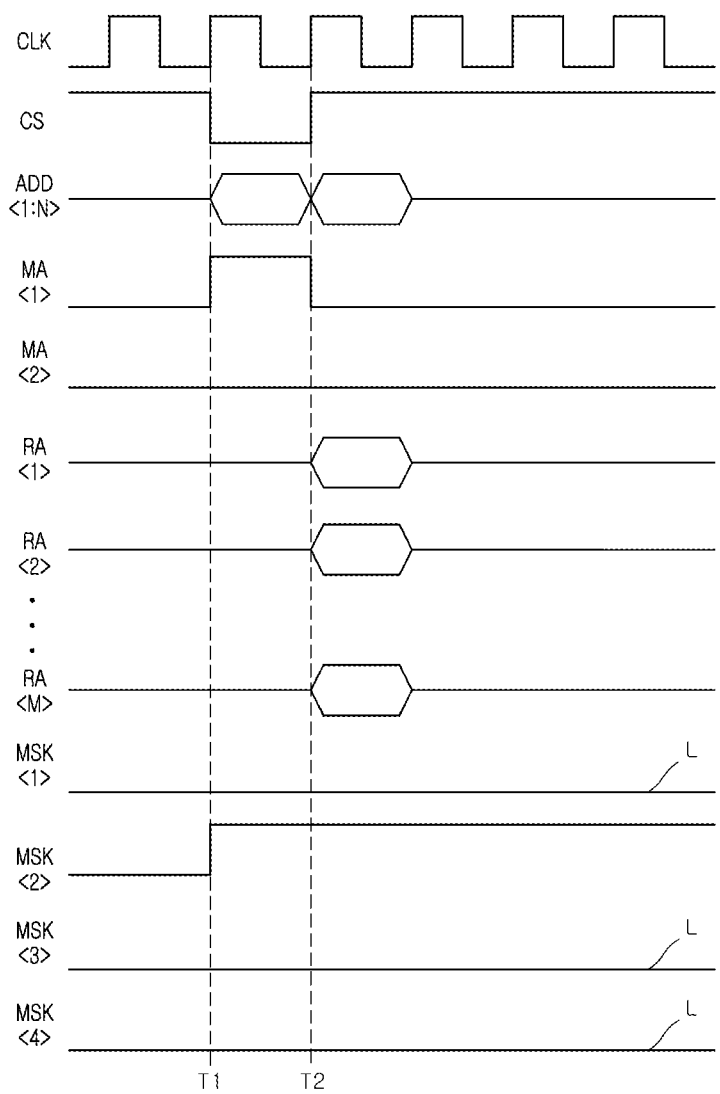
FIG. 4 is a timing diagram illustrating an operation of the semiconductor system of FIG. 1 according to an embodiment.

FIG. 4 is a timing diagram illustrating an example in which the first to fourth word line signal generation circuits 41, 42, 43, and 44 control the connection between the first to fourth address decoders 411, 421, 431, and 441 and the first to fourth fuse circuits 412, 422, 432, and 442 when a logic level combination of the addresses ADD <1:N> is set to select a word line included in the second bank 52.

At a time T1, the first semiconductor device 1 may output a first pulse of the clock signal CLK. The first semiconductor device 1 may output the addresses ADD <1:N> and the chip selection signal CS having a logic low level for entering the active operation. The addresses ADD <1:N> are outputted in one cycle of the clock signal CLK. The addresses ADD <1:N> have the same width as the chip selection signal CS.

The address input circuit 10 may generate the first masking address MA <1> having a logic high level (H) and the second masking address MA <2> having a logic low level (L) from the addresses ADD <1:N> inputted in synchronization with the first pulse of the clock signal CLK in response to the chip selection signal CS.

The masking signal generation circuit 20 may decode the first and second masking addresses MA <1:2> and generate the first masking signal MSK <1> having a logic low level (L), the second masking signal MSK <2> having a logic high level (H), the third masking signal MSK <3> having a logic low level (L), and the fourth masking signal MSK <4> having a logic low level (L).

The first word line signal generation circuit 41 of the word line signal generation circuit 40 may cut off the connection between the first address decoder 411 and the first fuse circuit 412 in response to the first masking signal MSK <1> having a logic low level (L). The second word line signal generation circuit 42 may connect the second address decoder 421 and the second fuse circuit 422 in response to the second masking signal MSK <2> having a logic high level (H). The third word line signal generation circuit 43 may cut off the connection between the third address decoder 431 and the third fuse circuit 432 in response to the third masking signal MSK <3> having a logic low level (L). The fourth word line signal generation circuit 44 may cut off the connection between the fourth address decoder 441 and the fourth fuse circuit 442 in response to the fourth masking signal MSK <4> having a logic low level (L).

At a time T2, the first semiconductor device 1 may output a second pulse of the clock signal CLK. The first semiconductor device 1 may output the addresses ADD <1:N> and the chip selection signal CS having a logic high level. The addresses ADD <1:N> are outputted in one cycle of the clock CLK. The addresses ADD <1:N> have the same width as the chip selection signal CS.

The address input circuit 10 may decode the addresses ADD <1:N> inputted in synchronization with the second pulse of the clock signal CLK in response to the chip selection signal CS and generate the row addresses RA <1:M>.

The internal address generation circuit 30 may decode the row addresses RA <1:M> and generate the internal addresses IADD <1:K>.

In the embodiment described above, while the first, third, and fourth address decoders 411, 431, and 441 are disconnected from the first, third, and fourth fuse circuits 412, 432, and 442, respectively, the second address decoder 421 is connected to the second fuse circuit 422 in response to the second masking signal MSK <2> having a logic high level (H). Therefore, the first word line signal generation circuit 41 of the word line signal generation circuit 40 may output the first word line signals MWL <1:8>, which are disabled, regardless of the internal addresses IADD <1:K>. The second word line signal generation circuit 42 may decode the internal addresses IADD <1:K> and generate the second word line signals MWL<9:16>, which are selectively enabled for selecting the target word line included in the second bank 52. The third word line signal generation circuit 43 may output the third word line signals MWL <17:24>, which are disabled, regardless of the internal addresses IADD <1:K>. The fourth word line signal generation circuit 44 may output the fourth word line signals MWL <25:32>, which are disabled, regardless of the internal addresses IADD <1:K>. That is, in this embodiment, when a masking signal MSK <i> is disabled, a corresponding address decoder does not perform an address decoding operation since it is disconnected from a corresponding fuse circuit, i being in a range of 1 to 4.

The second bank 52 in the memory region 50 may input or output data to or from a cell coupled to the target word line selected by the second word line signals MWL <9:16>. In this embodiment, the second masking signal MSK <2> maintains the logic high level (H) until the second bank 52 inputs or outputs the data in response to the second word line signals MWL <9:16>.

The semiconductor system according to an embodiment may reduce a load of address decoders by cutting off a connection between a fuse circuit and an unused address decoder according to the addresses for selecting the target word line included in the second bank 52. The unused address decoder represents an address decoder that is not used to select the target word line, e.g., any of the first, third, and fourth address decoders 411, 431, and 441.

Figure 5:
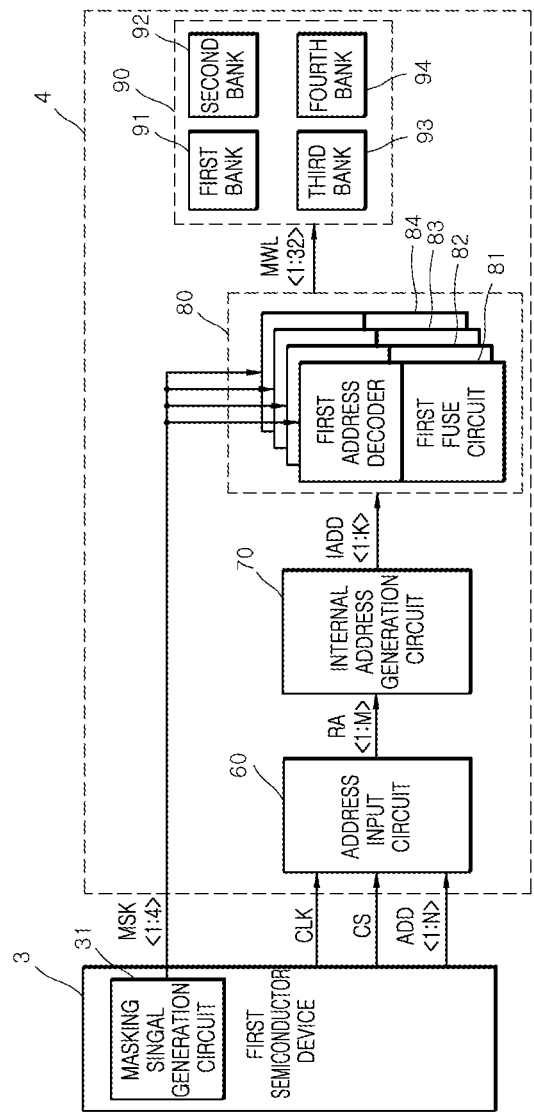
FIG. 5 is a block diagram illustrating a configuration of a semiconductor system according to another embodiment.

FIG. 5 is a block diagram illustrating a semiconductor system according to another embodiment. Referring to FIG. 5, the semiconductor system may include a first semiconductor device 3 and a second semiconductor device 4. The first semiconductor device 3 may include a masking signal generation circuit 31. The second semiconductor device 4 may include an address input circuit 60, an internal address generation circuit 70, a word line signal generation circuit 80, and a memory region 90.

The first semiconductor device 3 may output a clock signal CLK, a chip selection signal CS, addresses ADD <1:N>, and masking signals MSK <1:4>. The first semiconductor device 3 may output the clock signal CLK, which toggles. The first semiconductor device 3 may output the chip selection signal CS for entering an active operation. The first semiconductor device 3 may output the addresses ADD <1:N> in synchronization with the clock signal CLK. The first semiconductor device 3 may output the addresses ADD <1:N> for selecting the first to fourth banks 91, 92, 93, and 94 in the memory region 90, in synchronization with a first pulse of the clock signal CLK. The first semiconductor device 3 may output the addresses ADD <1:N> for selecting a plurality of word line groups included in the first to fourth banks 91, 92, 93, and 94, in synchronization with a second pulse of the clock signal CLK. A number N of bits included in the addresses ADD <1:N> may be implemented with various numbers of bits for selecting a plurality of word line groups included in the first to fourth banks 91, 92, 93, and 94. The first pulse of the clock signal CLK is a pulse that is generated firstly in the active operation activated by the chip selection signal CS. The second pulse of the clock CLK is a pulse that is generated secondly in the active operation.

The masking signal generation circuit 31 of the first semiconductor device 3 may decode the addresses ADD <1:N> and generate the masking signals MSK <1:4> for selecting one of the first to fourth banks 91, 92, 93, and 94. The masking signal generation circuit 31 generates the masking signals MSK <1:N>, which are selectively enabled according to a logic level combination of the addresses ADD <1:N>, in order to select one of the first to fourth banks 91, 92, 93, and 94. The masking signal generating circuit 31 may have substantially the same configuration and perform the same operations as the masking signal generating circuit 20 shown in FIG. 1. Therefore, a detailed description of the masking signal generating circuit 31 will be omitted.

The address input circuit 60 may generate row addresses RA <1:M> from the addresses ADD <1:N> inputted in synchronization with the clock signal CLK, in response to the chip selection signal CS. The address input circuit 60 may generate the row addresses RA <1:M> from the addresses ADD <1:N> inputted in synchronization with the clock signal CLK in the active operation.

The internal address generation circuit 70 may decode the row addresses RA <1:M> and generate internal addresses IADD <1:K>. A number M of bits of the row addresses RA <1:M> and a bit number K of the internal addresses IADD <1:K> may be set to a natural number.

The word line signal generation circuit 80 may decode the internal addresses IADD <1:K> and generate word line signals MWL <1:32>. The word line signal generation circuit 80 may control a connection between first to fourth address decoders and first to fourth fuse circuits in response to the masking signals MSK <1:4>.

More specifically, the word line signal generation circuit 80 may include a first word line signal generation circuit 81, a second word line signal generation circuit 82, a third word line signal generation circuit 83, and a fourth word line signal generation circuit 84. Each of the first to fourth word line signal generation circuits 81, 82, 83, and 84 may include an address decoder and a fuse circuit.

The first word line signal generation circuit 81 may decode the internal addresses IADD <1:K> and generate first word line signals MWL <1:8> to select a first word line group included in the first bank 91. The first word line signal generation circuit 81 may control the connection between a first address decoder (not shown) and a first fuse circuit (not shown) in response to the first masking signal MSK <1>.

The second word line signal generation circuit 82 may decode the internal addresses IADD <1:K> and generate second word line signals MWL <9:16> to select a second word line group included in the second bank 92. The second word line signal generation circuit 82 may control the connection between a second address decoder (not shown) and a second fuse circuit (not shown) in response to the second masking signal MSK <2>.

The third word line signal generation circuit 83 may decode the internal addresses IADD <1:K> and generate third word line signals MWL <17:24> to select a third word line group included in the third bank 93. The third word line signal generation circuit 83 may control the connection between a third address decoder (not shown) and a third fuse circuit (not shown) in response to the third masking signal MSK <3>.

The fourth word line signal generation circuit 84 may decode the internal addresses IADD <1:K> and generate fourth word line signals MWL <25:32> to select a fourth word line group included in the fourth bank 94. The fourth word line signal generation circuit 84 may control the connection between a fourth address decoder (not shown) and a fourth fuse circuit (not shown) in response to the fourth masking signal MSK <4>.

Here, the first to fourth fuse circuits may be implemented in the form of a general fuse circuit, in which a plurality of e-fuses are connected to form an array structure.

The first word line signal generation circuit 81, the second word line signal generation circuit 82, the third word line signal generation circuit 83, and the fourth word line signal generation circuit 84 have substantially the same configuration as the first word line signal generation circuit 41, the second word line signal generation circuit 42, the third word line signal generation circuit 43, and the fourth word line signal generation circuit 44 shown in FIG. 3, respectively. Therefore, a detailed description of the first to fourth word line signal generation circuits 81, 82, 83, and 84 will be omitted.

The memory region 90 may include the first bank 91, the second bank 92, the third bank 93, and the fourth bank 94. Each of the first bank 91, the second bank 92, the third bank 93, and the fourth bank 94 may be implemented with a general memory circuit including a plurality of word lines. Each of the first bank 91, the second bank 92, the third bank 93, and the fourth bank 94 may be implemented with a general memory circuit further including a redundancy word line to replace a defective word line in which a failure occurs. The first bank 91, the second bank 92, the third bank 93, and the fourth bank 94 may input or output data to or from a cell coupled to a word line selected by the word line signals MWL <1:32>. A number of banks included in the memory region 90 may be variously set according to embodiments.

Although each of the first bank 91, the second bank 92, the third bank 93, and the fourth bank 94 includes eight word lines for convenience of explanation in the present embodiment, each of the first bank 91, the second bank 92, the third bank 93, and the fourth bank 94 may include various numbers of word lines according to other embodiments.

The second semiconductor device 4 may decode the internal addresses IADD <1:K> generated from the addresses ADD <1:N> inputted in synchronization with the clock signal CLK to thereby select a target word line included in the first to fourth banks 91, 92, 93, and 94. The second semiconductor device 4 may control the connection between the first to fourth address decoders and the first to fourth fuse circuits for selecting the target word line in response to the masking signals MKS <1:4>.

The semiconductor system illustrated in FIG. 5 may reduce a load of address decoders by cutting off the connection between a fuse circuit and an unused address decoder according to an address for selecting the target word line of a selected bank. The unused address decoder represents an address decoder, which is not used to select the target word line.

Figure 6:
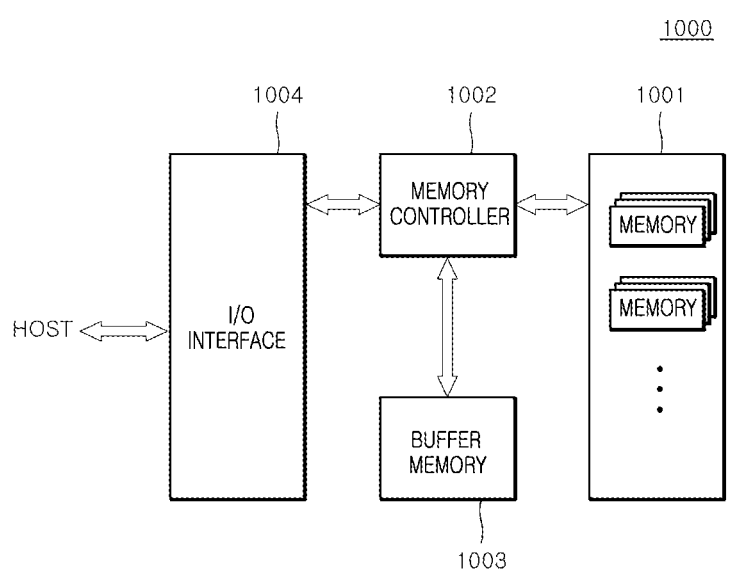
FIG. 6 is a block diagram illustrating a configuration of an electronic system employing the semiconductor system shown in FIGS. 1 to 5.

Any of the semiconductor systems described with reference to FIGS. 1 to 5 may be part of an electronic system that includes a memory system, a graphic system, a computing system, a mobile system, or the like. For example, as illustrated in FIG. 6, an electronic system 1000 according to an embodiment may include a data storage circuit 1001, a memory controller 1002, a buffer memory 1003, and an input/output (I/O) interface 1004.

The data storage circuit 1001 may store data transmitted from the memory controller 1002, or may read and output the stored data to the memory controller 1002, in response to a control signal generated by the memory controller 1002. The data storage circuit 1001 may include the second semiconductor device 2 illustrated in FIG. 1, the second semiconductor device 4 illustrated in FIG. 5, or both. The data storage circuit 1001 may further include a nonvolatile memory that can retain its stored data even when power supply is interrupted. The nonvolatile memory may be a flash memory, such as a NOR-type flash memory or a NAND-type flash memory, a phase change random access memory (PRAM), a resistive random access memory (RRAM), a spin transfer torque random access memory (STTRAM), a magnetic random access memory (MRAM), or the like.

The memory controller 1002 may receive a command from an external device (e.g., a host device) through the I/O interface 1004, and may decode the command received from the host device to control an operation for storing data in the data storage circuit 1001 or the buffer memory 1003, or to control an operation for outputting the data stored in the data storage circuit 1001 or the buffer memory 1003. The memory controller 1002 may include the first semiconductor device 1 illustrated in FIG. 1 or the first semiconductor device 3 illustrated in FIG. 5. Although FIG. 6 illustrates the memory controller 1002 with a single block, the memory controller 1002 may include a first controller for controlling the data storage circuit 1001 comprised of a nonvolatile memory, and a second controller for controlling the buffer memory 1003 comprised of a volatile memory.

The buffer memory 1003 may temporarily store data, which are processed by the memory controller 1002. That is, the buffer memory 1003 may temporarily store data, which are read from or to be stored in the data storage circuit 1001. The buffer memory 1003 may store the data, which are transmitted from the memory controller 1002, in response to a control signal generated by the memory controller 1002. The buffer memory 1003 may read out data from the data storage circuit 1001, temporarily store the read-out data, and output the read-out data to the memory controller 1002. The buffer memory 1003 may include a volatile memory such as a dynamic random access memory (DRAM), a mobile DRAM, a static random access memory (SRAM), or the like.

The I/O interface 1004 may physically and electrically connect the memory controller 1002 to the external device (i.e., the host device). Thus, the memory controller 1002 may receive control signals and data supplied by the external device (i.e., the host device) through the I/O interface 1004, and may output data from the memory controller 1002 to the external device (i.e., the host device) through the I/O interface 1004. That is, the electronic system 1000 may communicate with the host device through the I/O interface 1004. The I/O interface 1004 may include one or more of various interface protocols such as a universal serial bus (USB), a multi-media card (MMC), a peripheral component interconnect-express (PCI-E), a serial attached SCSI (SAS), a serial AT attachment (SATA), a parallel AT attachment (PATA), a small computer system interface (SCSI), an enhanced small device interface (ESDI), an integrated drive electronics (IDE), and so on.

The electronic system 1000 may be used as an auxiliary storage device of the host device or an external storage device. The electronic system 1000 may include a solid state disk (SSD), a USB memory, a secure digital (SD) card, a mini secure digital (mSD) card, a micro secure digital (micro SD) card, a secure digital high capacity (SDHC) card, a memory stick card, a smart media (SM) card, a multi-media card (MMC), an embedded multi-media card (eMMC), a compact flash (CF) card, or the like.

Embodiments of the present disclosure have been disclosed above for illustrative purposes. Those skilled in the art will appreciate that various modifications, additions and substitutions are possible, without departing from the scope and spirit of the present disclosure as disclosed in the accompanying claims.

What is claimed is:

1. A semiconductor system comprising:
a first semiconductor device configured to output a clock signal and a chip selection signal, and to output first and second addresses in synchronization with the clock signal; and
a second semiconductor device configured to generate a masking signal and to decode internal addresses, the masking signal being generated from masking addresses, the masking addresses being generated from the first addresses inputted in synchronization with a first pulse of the clock signal and in response to the chip selection signal, the internal addresses being generated from the second addresses inputted to the second semiconductor device in synchronization with a second pulse of the clock signal, the second addresses being inputted after the first addresses,
wherein the second semiconductor device includes an address decoder and a fuse circuit, and is configured to control a connection between the address decoder and the fuse circuit in response to the masking signal, and
wherein the address decoder, which is connected to the fuse circuit when the masking signal is enabled, selects a target word line of a memory region in the second semiconductor device using the internal addresses.

2. The semiconductor system of claim 1, wherein the first addresses inputted in synchronization with the first pulse of the clock signal include information for selecting first and second banks included in the memory region.

3. The semiconductor system of claim 1, wherein the second semiconductor device includes:
an address input circuit configured to receive the first addresses in synchronization with the first pulse of the clock signal and in response to the chip selection signal, to output the first addresses as the masking addresses, to receive the second addresses in synchronization with the second pulse of the clock signal, and to output the second addresses as row addresses;
a masking signal generation circuit configured to decode the masking addresses and generate first and second masking signals, the first and second masking signals corresponding to the masking signal;
an internal address generation circuit configured to decode the row addresses and to generate the internal addresses; and
a word line signal generation circuit configured to control a connection between a first address decoder and a first fuse circuit in response to the first masking signal, and to control a connection between a second address decoder and a second fuse circuit in response to the second masking signal, wherein the word line signal generation circuit decodes the internal addresses and generates first and second word line signals.

4. The semiconductor system of claim 3, wherein the word line signal generation circuit connects one of the first and second address decoders and a corresponding one of the first and second fuse circuits in response to the first and second masking signals.

5. The semiconductor system of claim 3, wherein the memory region includes first and second banks, and
wherein the word line signal generation circuit includes:
a first word line signal generation circuit configured to decode the internal addresses and to generate the first word line signal for selecting a first word line group included in the first bank, wherein the first word line signal generation circuit controls the connection between the first address decoder and the first fuse circuit; and
a second word line signal generation circuit configured to decode the internal addresses and to generate the second word line signal for selecting a second word line group included in the second bank, wherein the second word line signal generation circuit controls the connection between the second address decoder and the second fuse circuit.

6. The semiconductor system of claim 5, wherein the first word line signal generation circuit includes:
the first address decoder configured to decode the internal address and to generate the first word line signal;
the first fuse circuit configured to repair the internal addresses when the internal addresses have a logic level combination for selecting a defective word line, a failure occurring in the defective word line, the defective word line being included in the first bank; and a first switch circuit configured to control the connection between the first address decoder and the first fuse circuit in response to the first masking signal.

7. The semiconductor system of claim 5, wherein the second word line signal generation circuit includes:
the second address decoder configured to decode the internal addresses and generate the second word line signal;
the second fuse circuit configured to repair the internal addresses when the internal addresses have a logic level combination for selecting a defective word line, a failure occurring in the defective word line, the defective word line being included in the second bank; and
a second switch circuit configured to control the connection between the second address decoder and the second fuse circuit in response to the second masking signal.

* * * * *